(12) United States Patent
Ahn et al.

(10) Patent No.: US 11,708,820 B2
(45) Date of Patent: Jul. 25, 2023

(54) HYBRID DRIVE DEVICE

(71) Applicant: AGENCY FOR DEFENSE DEVELOPMENT, Daejeon (KR)

(72) Inventors: Sung Hoon Ahn, Seoul (KR); Jin Woo Oh, Seoul (KR); Gil Yong Lee, Seoul (KR); Sung Hyuk Song, Seoul (KR); Min Sik Kim, Seoul (KR); Woo Kyun Jung, Seoul (KR); Hye Sung Lee, Seoul (KR)

(73) Assignee: AGENCY FOR DEFENSE DEVELOPMENT, Daejeon (KR)

( * ) Notice: Subject to any disclaimer, the term of this patent is extended or adjusted under 35 U.S.C. 154(b) by 1076 days.

(21) Appl. No.: 16/441,932

(22) Filed: Jun. 14, 2019

(65) Prior Publication Data
US 2020/0144478 A1    May 7, 2020

(30) Foreign Application Priority Data
Nov. 7, 2018   (KR) .......................... 10-2018-0136021

(51) Int. Cl.
| F03G 7/06   | (2006.01) |
| H10N 30/80  | (2023.01) |
| H10N 30/857 | (2023.01) |
| H10N 30/20  | (2023.01) |

(52) U.S. Cl.
CPC ........... *F03G 7/06* (2013.01); *H10N 30/2047* (2023.02); *H10N 30/802* (2023.02); *H10N 30/857* (2023.02)

(58) Field of Classification Search
CPC .................................................... F03G 7/0614
See application file for complete search history.

(56) References Cited

U.S. PATENT DOCUMENTS

| 4,716,731 A * | 1/1988 | Sakai .................. F03G 7/065 60/527 |
| 6,133,547 A * | 10/2000 | Maynard ............... F03G 7/065 337/140 |
| 7,575,807 B1 * | 8/2009 | Barvosa-Carter ....... F03G 7/065 428/411.1 |
| 2010/0171393 A1 * | 7/2010 | Pei ........................ H01L 41/098 359/566 |
| 2012/0228999 A1 * | 9/2012 | Yamamoto .............. F03G 7/005 310/330 |
| 2014/0255534 A1 * | 9/2014 | Allen ..................... F03G 7/005 425/542 |

(Continued)

FOREIGN PATENT DOCUMENTS

| JP | 2005230957 A | 9/2005 |
| JP | 2007092556 A | 4/2007 |

(Continued)

OTHER PUBLICATIONS

Office Action issued in Korean Application No. 10-2018-0136021, dated Dec. 27, 2019, 6 pages.

*Primary Examiner* — Jonathan R Matthias
(74) *Attorney, Agent, or Firm* — Quarles & Brady LLP

(57) ABSTRACT

Provided is a hybrid drive device including a main power source; an auxiliary power source; a main deformation part configured to be deformable in response to receiving a voltage from the main power source; and an auxiliary deformation part configured to connect to the main deformation part and to be deformable in response to receiving a voltage from the auxiliary power source.

14 Claims, 7 Drawing Sheets

(56) References Cited

U.S. PATENT DOCUMENTS

2015/0001994 A1* 1/2015 Ahn ............... H01L 41/094
                                                                          310/330
2019/0003024 A1* 1/2019 Elliot ............... A61B 17/00

FOREIGN PATENT DOCUMENTS

| KR | 20100024041 A | 3/2010 |
| KR | 20130134037 A | 12/2013 |
| KR | 20170128190 A | 11/2017 |

* cited by examiner

HYBRID DRIVE DEVICE

CROSS-REFERENCE TO RELATED APPLICATION(S)

This application claims the priority benefit of Korean Patent Application No. 10-2018-0136021 filed on Nov. 7, 2018, in the Korean Intellectual Property Office, the disclosure of which is incorporated herein by reference for all purposes.

BACKGROUND

1. Field

One or more example embodiments relate to a hybrid drive device.

2. Description of Related Art

Shape memory alloys, piezoelectric elements, or electroactive polymer composites called smart materials have been utilized in various forms for active or passive control of a structure through recent studies. Here, a smart soft composite (SSC) fabricated by applying a shape memory alloy, a directional structure, and a polymer material may be directly attached to a structure or bonded with another material to be used as an actuator.

Such an actuator may implement operations, such as bending and twisting, and such bending or twisting operations may apply to implement a flapping actuator. Accordingly, an actuator using the SSC may apply to various types of fields, for example, toys for children, robots, flexible devices, and other home, industrial, and/or military equipment.

An ionic polymer metal composite (IPMC) may have a bending deformation, for example, be bent by electroosmosis. For example, the IPMC may include an ionic polymer membrane and metal electrodes provided on both surfaces of the ionic polymer membrane. The ionic polymer membrane may absorb a large amount of polar solvent, for example, water. Once a voltage is applied between the metal electrodes, a cation moves toward an anode among the metal membranes with water molecules in the ionic polymer membrane. Accordingly, the volume of the ionic polymer membrane near the anode expands due to an increase in the water molecules and the ionic polymer membrane around a cathode among the metal electrodes contracts due to a reduction in the water molecules. Accordingly, the ionic polymer membrane bends toward the cathode.

SUMMARY

At least one example embodiment provides a hybrid drive device that may be applicable to various types of biomimetic robots by effectively applying characteristics of two different materials.

According to an aspect of at least one example embodiment, there is provided a hybrid drive device including a main power source; an auxiliary power source; a main deformation part configured to be deformable in response to receiving a voltage from the main power source; and an auxiliary deformation part configured to connect to the main deformation part and to be deformable in response to receiving a voltage from the auxiliary power source.

The main deformation part may include a first driver including a first main base and a first deformable member configured to be received in the first main base and to electrically connect to the main power source; a second driver including a second main base and a second deformable member configured to be received in the second main base and to electrically connect to the main power source; and a directional member configured to be provided between the first driver and the second driver and to set a direction in which each of the first driver and the second driver deforms.

Each of the first deformable member and the second deformable member may include a shape member alloy or a shape memory polymer.

The auxiliary deformation part may be configured to be supported by the directional member in a state in which at least a portion of the auxiliary deformation part is inserted into the directional member.

The directional member may be configured to be hardened and to support the auxiliary deformation part in a state in which at least a portion of the auxiliary deformation part is received in the directional member.

The auxiliary deformation part may include an auxiliary base configured to contain a cation; a first coating plate configured to be coated on one surface of the auxiliary base; a second coating plate configured to be coated on the other surface of the auxiliary base; and an auxiliary wire configured to connect each of the first coating plate and the second coating plate to the auxiliary power source.

An end of the auxiliary wire that is connected to the first coating plate and the second plating may be configured to insert into the directional member.

A shape of the auxiliary base may be determined based on a voltage that is applied to the first coating plate and the second coating plate.

The auxiliary deformation part may be configured to be supported by the main deformation part in a state in which at least a portion of the auxiliary deformation part is inserted into the main deformation part.

The main deformation part may be relatively rigid compared to the auxiliary deformation part.

A magnitude of a voltage applied from the main power source to the main deformation part may be greater than a magnitude of a voltage applied from the auxiliary power source to the auxiliary deformation part.

The hybrid drive device may further include a controller configured to control the main power source and the auxiliary power source.

According to an aspect of at least one example embodiment, there is provided a hybrid drive device including a first driver including a first main base and a first deformable member configured to be received in the first main base and to be deformable in response to receiving a voltage from an outside; a second driver including a second main base and a second deformable member configured to be received in the second main base and to be deformable in response to receiving a voltage from the outside; a plurality of directional members configured to be stacked between the first driver and the second driver and to set a direction in which each of the first driver and the second driver deforms; and an auxiliary deformation part configured to connect to one of the plurality of directional members and to be deformable in response to receiving a voltage from the outside.

Each of the first deformable member and the second deformable member may include a shape member alloy or a shape memory polymer.

The auxiliary deformation part may be configured to be supported by one of the plurality of directional members in a state in which at least a portion of the auxiliary deformation part is inserted into one of the plurality of directional members.

The directional member may be configured to be hardened and to support the auxiliary deformation part in a state in which at least a portion of the auxiliary deformation part is received in the directional member.

The auxiliary deformation part may include an auxiliary base configured to contain a cation; a first coating plate configured to be coated on one surface of the auxiliary base; and a second coating plate configured to be coated on the other surface of the auxiliary base.

According to some example embodiments, a hybrid drive device may appropriately apply to a biomimetic robot using a main deformation part having a relatively great force and rigidity and an auxiliary deformation part configured to be relatively greatly deformable and to implement a high speed.

Additional aspects of example embodiments will be set forth in part in the description which follows and, in part, will be apparent from the description, or may be learned by practice of the disclosure.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

Figure 1:
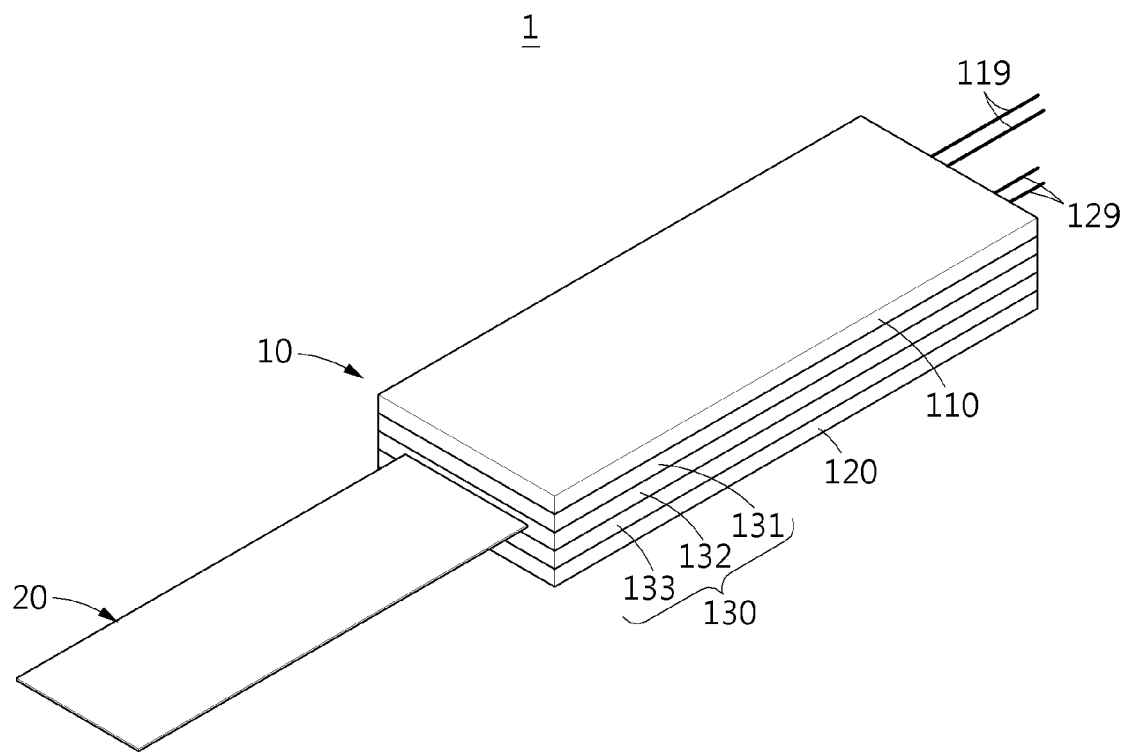
FIG. 1 is a perspective view of a hybrid drive device according to an example embodiment.

Hereinafter, example embodiments will be described in detail with reference to the accompanying drawings. It should be understood, however, that there is no intent to limit this disclosure to the particular example embodiments disclosed. On the contrary, example embodiments are to cover all modifications, equivalents, and alternatives falling within the scope of the example embodiments.

Although terms such as "first," "second," "A", "B", "a", and "b" may be used herein to describe various members, components, regions, layers, or sections, these members, components, regions, layers, or sections are not to be limited by these terms. Throughout the specification, when an element, such as a layer, region, or substrate, is described as being "on," "connected to," or "coupled to" another element, it may be directly "on," "connected to," or "coupled to" the other element, or there may be one or more other elements intervening therebetween.

Regarding the reference numerals assigned to the elements in the drawings, it should be noted that the same elements will be designated by the same reference numerals, wherever possible, even though they are shown in different drawings. Also, in the description of embodiments, detailed description of well-known related structures or functions will be omitted when it is deemed that such description will cause ambiguous interpretation of the present disclosure.

Figure 2:
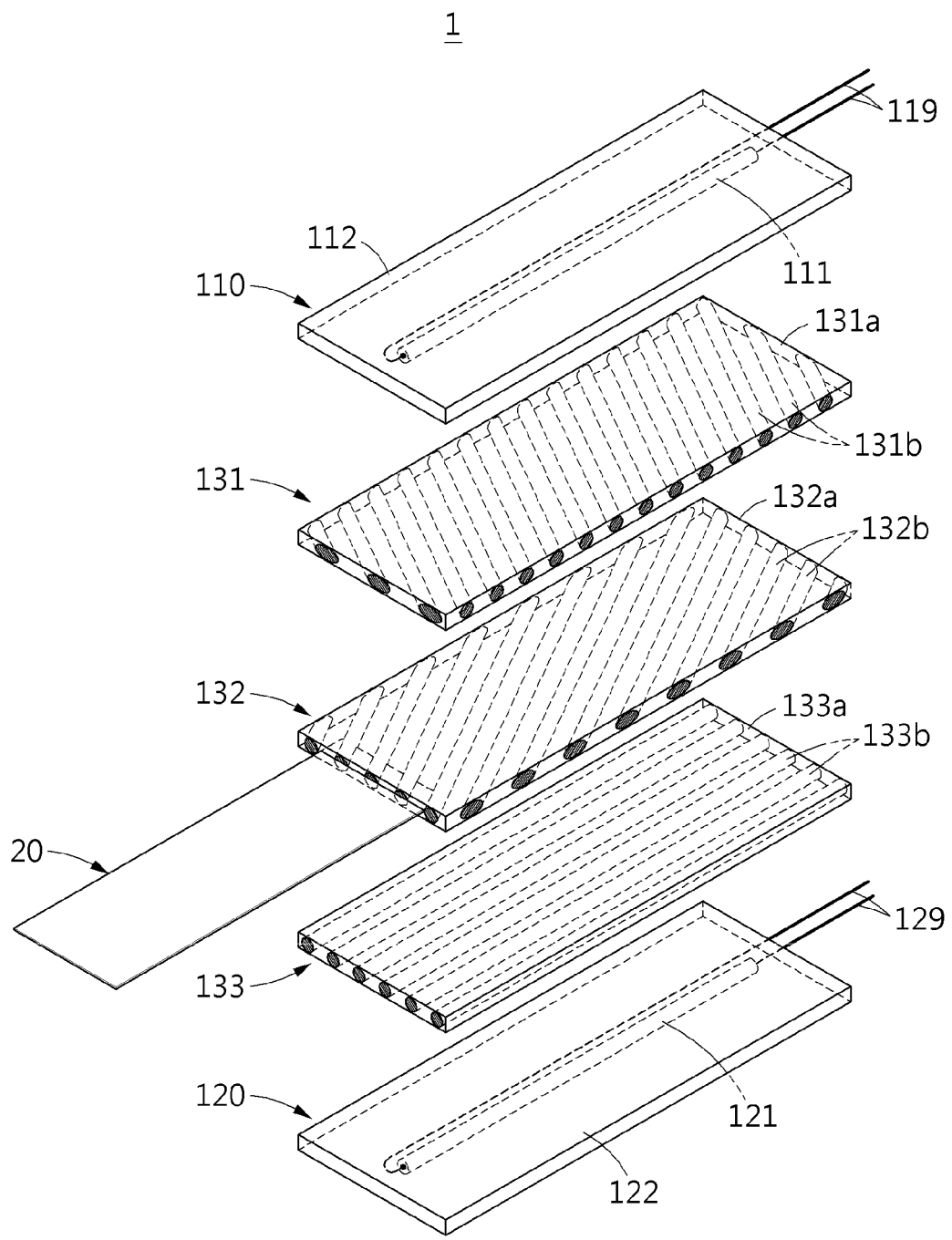
FIG. 2 is an exploded perspective view of a hybrid drive device according to an example embodiment.
Figure 3:
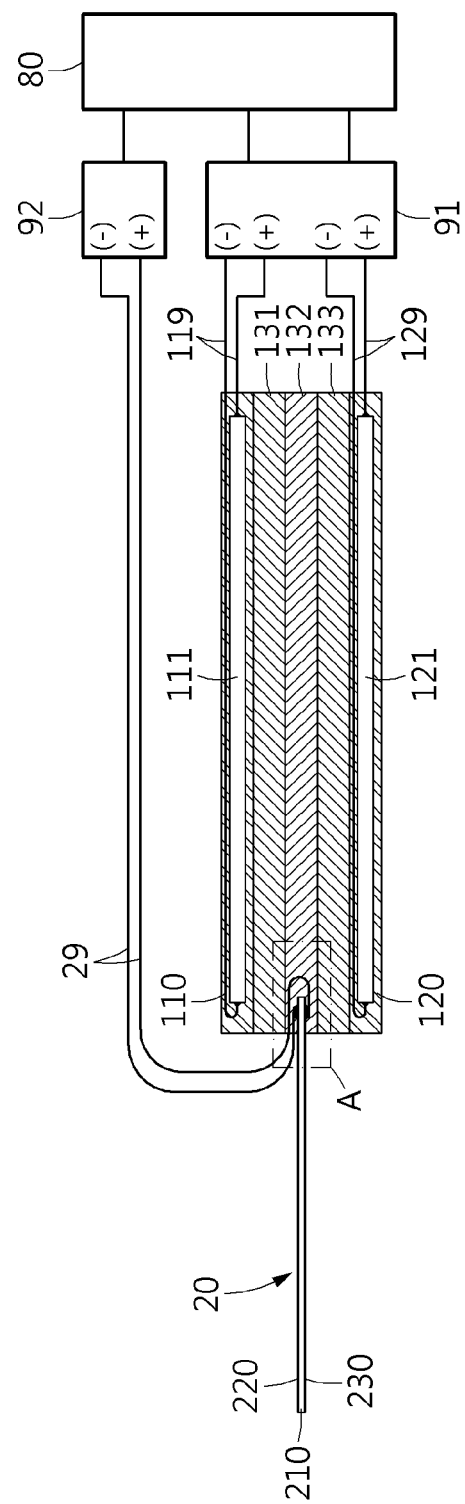
FIG. 3 is a cross-sectional view of a hybrid drive device according to an example embodiment.

FIG. 1 is a perspective view of a hybrid drive device according to an example embodiment, FIG. 2 is an exploded perspective view of a hybrid drive device according to an example embodiment, and FIG. 3 is a cross-sectional view of a hybrid drive device according to an example embodiment.

Figure 4:
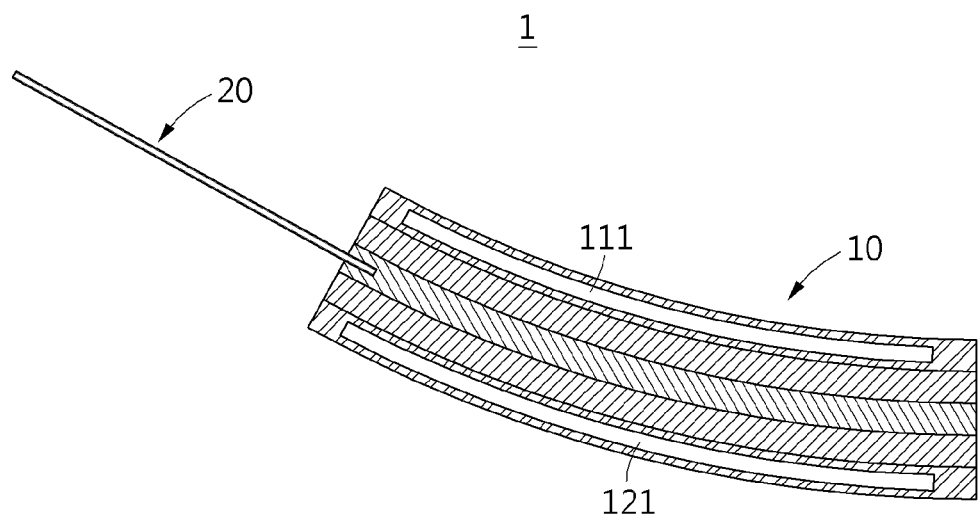
FIGS. 4 and 5 are cross-sectional views illustrating an example of deforming a main deformation part of a hybrid drive device according to an example embodiment.
Figure 5:
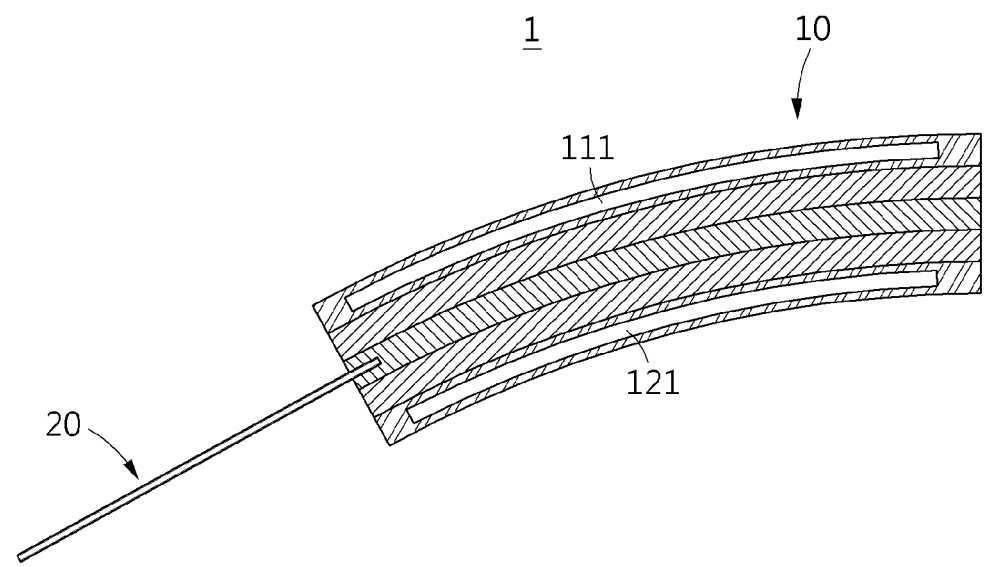
Figure 6:
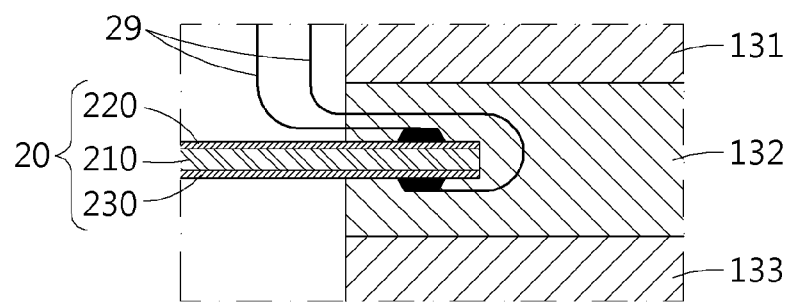
FIG. 6 is an enlarged cross-sectional view of an A part of FIG. 3.
Figure 7:
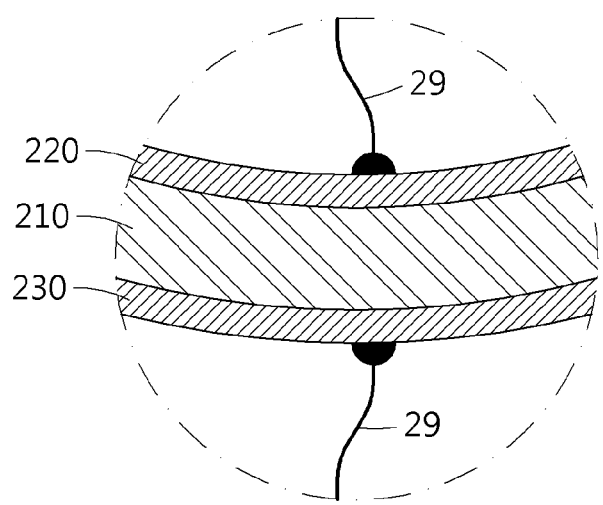
FIG. 7 is a cross-sectional view illustrating an example of deforming an auxiliary deformation part of a hybrid drive device according to an example embodiment.

FIGS. 4 and 5 are cross-sectional views illustrating an example of deforming a main deformation part of a hybrid drive device according to an example embodiment, FIG. 6 is an enlarged cross-sectional view of an A part of FIG. 3, and FIG. 7 is a cross-sectional view illustrating an example of deforming an auxiliary deformation part of a hybrid drive device according to an example embodiment.

Referring to FIGS. 1 to 7, a hybrid drive device 1 may include a main deformation part 10 and an auxiliary deformation part 20. The hybrid drive device 1 may implement various operations using the main deformation part 10 and the auxiliary deformation part 20 that independently operate. The hybrid drive device 1 may appropriately apply to a biomimetic robot. For example, if the hybrid drive device 1 is applied to a biomimetic robot that imitates a wing motion of a bird, the main deformation part 10 may act as a skeleton of a wing of the bird and the auxiliary deformation part 20 may act as bird feathers. As another example, if the hybrid drive device 1 is applied to a biomimetic robot that imitates a movement of a fin, the main deformation part 10 may act as a skeleton of the fin and the auxiliary deformation part 20 may act as a flexible edge portion of the fin. As described above, the main deformation part 10 may be used to generate a propulsion power and the auxiliary deformation part 20 may be used to adjust a fine balance.

The main deformation part 10 may be a smart soft composite (SSC). The main deformation part 10 may have a relatively great force and rigidity compared to the auxiliary deformation part 20. The main deformation part 10 may be deformable in response to receiving a voltage and/or current from a main power source 91. The main deformation part 10 may include a first driver 110, a second driver 120, and a directional member 130.

The first driver 110 may include a first deformable member 111, a first main base 112, and a first main wire 119. The first driver 110 may have an entire bending or twisting deformation by the first deformable member 111.

The first deformable member 111 may include a smart material. Although the first deformable member 111 includes a shape memory alloy or a shape memory polymer, it is provided as an example only. Any material deformable by an external signal such as a voltage and/or current signal may be applied to the first deformable member 111. The first deformable member 111 may be electrically connected to the main power source 91. For example, due to a change in a phase by a Joule heat occurring in response to applying a voltage and/or current, the first deformable member 111 may have a contracting deformation.

The first main base 112 may include a flexible material. For example, the first main base 112 may be formed of a flexible polymer-based material such as synthetic rubber, however, it is provided as an example only. The first main base 112 may include the first deformable member 111. For example, at least a portion of the first deformable member 111 may insert into the first main base 112. The first main base 112 may be deformed with the first deformable member 111 in response to deformation of the first deformable member 111. For example, if the first deformable member 111 is in a linear shape, the first main base 112 may be in a flat shape. If the first deformable member 111 has a bending deformation, that is, is bent, the first main base 112 may also have a bending deformation, that is, be bent.

The first main wire 119 may electrically connect the first deformable member 111 and the main power source 91. Here, at least a portion of the first main wire 119 may be received in the first main base 112.

The second driver 120 may include a second deformable member 121, a second main base 122, and a second main wire 129. The second driver 120 may have an entire bending or twisting deformation by the second deformable member 121. The description related to the first deformable member 111, the first main base 112, and the first main wire 119 may apply to the second deformable member 121, the second main base 122, and the second main wire 129.

FIG. 4 illustrates an example of a state in which a voltage is applied to the first deformable member 111, and FIG. 5 illustrates an example of a state in which a voltage is applied to the second deformable member 121. In response to a voltage being applied to one of the first deformable member 111 and the second deformable member 121, the main deformation part 10 may be deformed in a direction in which the voltage is applied to the deformable member. Although FIGS. 4 and 5 illustrate an example of a bending deformation without twisting, it is provided as an example only. The main deformation part 10 may simultaneously perform a twisting deformation and a bending deformation. The main power source 91 may alternately apply a voltage to the first deformable member 111 and the second deformable member 121 such that the main deformation part 10 may be bent or twisted alternately to the left and right. Through this driving, the main deformation part 10 may generate a propulsion power.

The directional member 130 may be provided between the first driver 110 and the second driver 120 and may set a direction in which the first driver 110 and the second driver 120 deform. For example, the directional member 130 may assist the main deformation part 10 to have a bending deformation only, to have a twisting deformation only, or to have the bending and twisting deformation at the same time. A plurality of directional members 130 may be stacked. The directional members 130 may be stacked in parallel on the first main base 112 and/or the second main base 122. The directional members 130 may include a first directional member 131, a second directional member 132, and a third directional member 133. Although description is made based on three directional members 130, it is provided as an example only. For example, only a single directional member 130 may be provided.

The directional member 130 may be formed of a hardening material. The directional member 130 may receive at least a portion of the auxiliary deformation part 20. The directional member 130 may be hardened in a state in which at least a portion of the auxiliary deformation part 20 is received in the directional member 130 and thereby support the auxiliary deformation part 20. For example, the directional member 130 may be in a liquid state at an initial stage and may be in a flexible solid state after being hardened. Although the direction member 130 is hardened, the directional member 130 has a flexibility and thus, is twistable or bendable. Since the directional member 130 is hardened in a state in which at least a portion of the auxiliary deformation part 20 is received in the directional member, the directional member 130 may stably support the auxiliary deformation part 20. Also, since the auxiliary deformation part 20 is combinable with the directional member 130 without using separate adhesives, it is possible to prevent a change in a physical property of the auxiliary deformation part 20.

The first directional member 131 may include a first directional base 131a and a first guide member 131b. The first directional member 131 may be formed using a flexible material. The first guide member 131b may be provided in the first directional base 131a. Also, a plurality of first guide members 131b may be provided in parallel. The first guide member 131b may have a rigidity different from a rigidity of the first directional base 131a. For example, the first guide member 131b may be relatively rigid compared to the first directional base 131a.

The second directional member 132 may include a second directional base 132a and a second guide member 132b. The second directional member 132 may be formed using a flexible material. The second guide member 132b may be provided in the second directional base 132a, and a plurality of second guide members 132b may be provided in parallel. The second guide member 132b may be aligned at an angle different from an angle of the first guide member 131b. The second guide member 132b may have a rigidity different from a rigidity of the second directional base 132a.

The third directional member 133 may include a third directional base 133a and a third guide member 133b. The third directional member 133 may be formed using a flexible material. The third guide member 133b may be provided in the third directional base 133a, and a plurality of third guide members 133b may be provided in parallel. The third guide member 133b may be aligned at an angle different from angles of the first guide member 131b and the second guide member 132b. The third guide member 133b may have a rigidity different from a rigidity of the third directional base 133a.

A deformation direction of the main deformation part 10 may be set based on an angle at which each of the first guide member 131b, the second guide member 132b, and the third guide member 133b is aligned.

The auxiliary deformation part 20 may be an Ionic Polymer Metal Composite (IPMC). The auxiliary deformation part 20 may have a bending deformation, that is, be bent due to electro-osmosis. The auxiliary deformation part 20 may be greatly deformable compared to the main deformation part 10 and may operate at a high speed. The auxiliary deformation part 20 may be connected to the main deformation part 10 and may be deformable independently from the main deformation part 10. The auxiliary deformation part 20 may be deformable in response to receiving a voltage and/or current from an auxiliary power source 92.

At least a portion of the auxiliary deformation part 20 may couple with the directional member 130. For example, the auxiliary deformation part 20 may insert into the directional member 130 that is in a liquid state and the directional member 130 that is in the liquid state may be hardened in a state in which the auxiliary deformation part 20 is received in the directional member 130 and may be changed to be in a flexible solid state. One end of the auxiliary deformation part 20 may be inserted into the directional member 130 and, in this state, the auxiliary deformation part 20 may be fastened to the directional member 130. For example, at least a portion of the auxiliary deformation part 20 may insert into the second directional member 132. The second directional member 132 may receive a portion of the auxiliary deformation part 20 and may support the auxiliary deformation part 20. The above connection method does not require a separate adhesive material. Accordingly, it is possible to prevent a change in a physical property of the auxiliary deformation part 20. The auxiliary deformation part 20 may include an auxiliary base 210, a first coating plate 220, and a second coating plate 230. The first coating plate 220 and the second coating plate 230 may be connected to the auxiliary power source 92 through an auxiliary wire 29.

The auxiliary base 210 may contain a cation. The auxiliary base 210 may be, for example, an ionic polymer membrane. The auxiliary base 210 may be formed of, for example, Nafion. The auxiliary base 210 may expand in an aqueous solution such as water and may have a hydrophile property. The auxiliary base 210 may absorb a large amount of polar solvent, for example, water. Both surfaces of the auxiliary base 210 may be coated using the first coating plate 220 and the second coating plate 230. In response to a voltage being applied between the first coating plate 220 and the second coating plate 230, a cation within the auxiliary base 210 may move toward an anode between the first coating plate 220 and the second coating plate 230 with water molecules. Accordingly, the auxiliary base 210 around the anode expands in response to an increase in water molecules and the auxiliary base 210 contracts around the cathode in response to a decrease in water molecules. Accordingly, the auxiliary deformation part 20 may have a bending deformation, that is, be bent, toward the cathode.

Each of the first coating plate 220 and the second coating plate 230 may be connected to the auxiliary power source 92 through the auxiliary wire 29. The first coating plate 220 and the second coating plate 230 may be formed using a material having a relatively high electrical conductivity. For example, the first coating plate 220 and the second coating plate 230 may be formed of a metal, such as gold and platinum. An end of the auxiliary wire 29 that is connected to the first coating plate 220 and the second coating plate 230 may couple with the directional member 130, for example, the second directional member 132. The auxiliary deformation part 20 may couple with an inside of the second directional member 132 in a state in which the auxiliary wire 29 is attached. The second directional member 132 in a liquid state may be hardened in a state in which the auxiliary deformation part 20 is partially received in the second directional member 132 and may be changed to be in a flexible solid state. Since a contact point between the auxiliary wire 29 and the auxiliary deformation part 20 inserts into the second directional member 132, the auxiliary wire 29 and the auxiliary deformation part 20 may maintain a stable coupling state.

The main power source 91 may apply a voltage to only one of the first deformable member 111 and the second deformable member 121. A driving type of the main deformation part 10 may be determined based on a power that is applied from the main power source 91 to the first deformable member 111 and the second deformable member 121.

The auxiliary power source 92 may apply a +voltage to one of the first coating plate 220 and the second coating plate 230 and may apply a −voltage to the other one thereof. A driving type of the auxiliary deformation part 20 may be determined based on a power that is applied from the auxiliary power source 92 to the first coating plate 220 and the second coating plate 230. The main power source 91 may apply current of 0.45 A at a voltage of 10V as an example of driving the deformation part 10 at a speed of 1 hertz (Hz), and the auxiliary power source 92 may require a low power condition of 50 µA at a voltage of 5V as an example of driving the auxiliary deformation part 20 at a speed of 1 Hz. Through the above example, in terms of a voltage for driving the main deformation part 10 and the auxiliary deformation part 20 configured using different structures and materials at the same speed, a voltage required for the main power source 91 is about twice or more as much as a voltage required for the auxiliary power source 92. A current difference is much greater than the aforementioned voltage difference.

A controller 80 may independently control the main power source 91 and the auxiliary power source 92. The controller 80 may determine a driving type of the main deformation part 10 by controlling a voltage and/or current that is applied from the main power source 91 to the main deformation part 10. Also, the controller 80 may determine a driving type of the auxiliary deformation part 20 by controlling a voltage and/or current that is applied from the auxiliary power source 92 to the auxiliary deformation part 20.

The controller 80 may implement various types of driving modes by driving, alone or in combination, the main power source 91 and the auxiliary power source 92.

A Young's modulus representing a physical characteristic of the first deformable member 111 and/or the second deformable member 121 that is main constituent material of the main deformation part 10 shows 30 to 70 GPa and the auxiliary deformation part 20 has a Young's modulus of 1 to 1.5 GPa. This physical characteristic difference indicates that the main deformation part 10 and the auxiliary deformation part 20 have completely different physical properties.

The hybrid drive device 1 may apply to various biomimetic robots. For example, if the hybrid drive device 1 is applied to a robot that imitates a wing motion of a bird, the main deformation part 10 may act as a skeleton of a wing of the bird that generates a lift and the auxiliary deformation part 20 may act as bird feathers that form a flight stability.

As another example, if the hybrid drive device 1 is applied to a robot that imitates a movement of a fin, the main deformation part 10 may act as a skeleton forming a propulsion power and the auxiliary deformation part 20 may act as a flexible edge portion that generates a fine balance.

As another example, the hybrid drive device 1 may perform a direction detection, a data collection, and transmission of collected data, by enabling the main deformation part 10 to act as a torso or a skeleton and enabling the auxiliary deformation part 20 to act as an antenna.

Also, a mechanical property of the auxiliary deformation part 20 of the hybrid drive device 1 may vary based on a humidity in the air. The controller 80 may detect a change in the mechanical property of the auxiliary deformation part 20 and may change an operational mode in response to the detected change.

Figure 8:
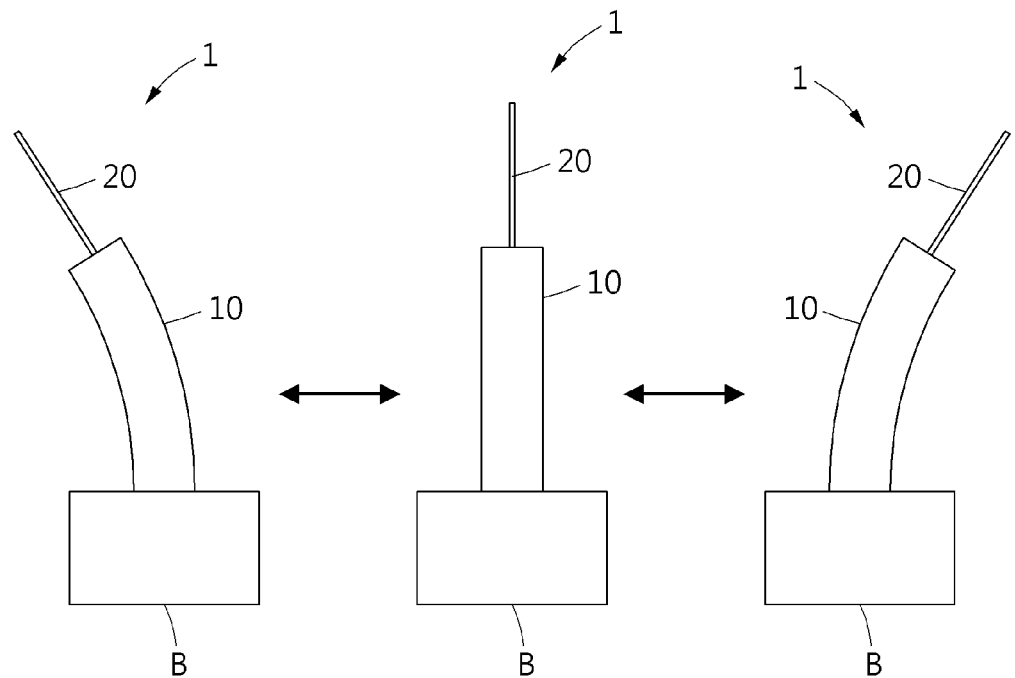
FIG. 8 illustrates an example of driving only a main deformation part of a hybrid device according to an example embodiment.

FIG. 8 illustrates an example of driving only a main deformation part of a hybrid device according to an example embodiment.

Referring to FIG. 8, the hybrid drive device 1 may be fastened to a body B. The body B may support one end of the main deformation part 10. The hybrid drive device 1 may drive only the main deformation part 10 without driving the auxiliary deformation part 20. The main deformation part 10 may have an iterative bending and/or twisting distortion to the left and right and may generate a propulsion power.

Figure 9:
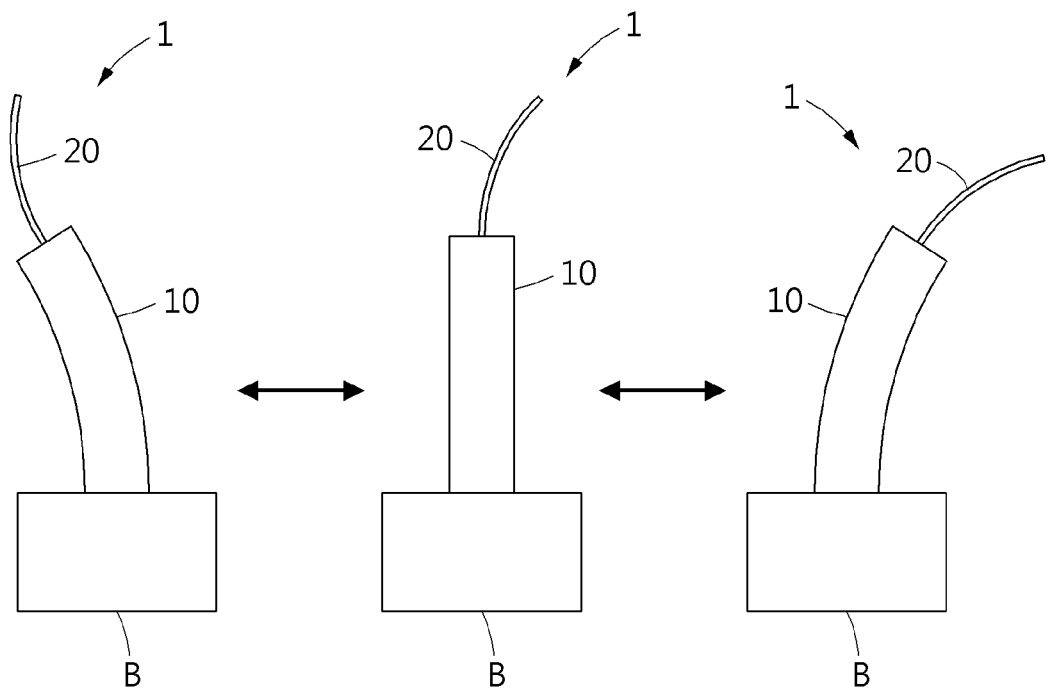
FIG. 9 illustrates an example of driving a main deformation part in a state in which an auxiliary deformation part of a hybrid drive device is deformed according to an example embodiment.

FIG. 9 illustrates an example of driving a main deformation part in a state in which an auxiliary deformation part of a hybrid drive device is deformed according to an example embodiment.

Referring to FIG. 9, the hybrid drive device 1 may drive the main deformation part 10 in a state in which the auxiliary deformation part 20 has a bending deformation, that is, is bent in one direction. Through such an operating mechanism, the hybrid drive device 1 may imitate, for example, a leg movement of a water strider. The auxiliary deformation part 20 may increase a contact surface area with the surface of water and secure a stability through the bending deformation and may move on the surface of water in response to left-right movement of the main deformation part 10.

Figure 10:
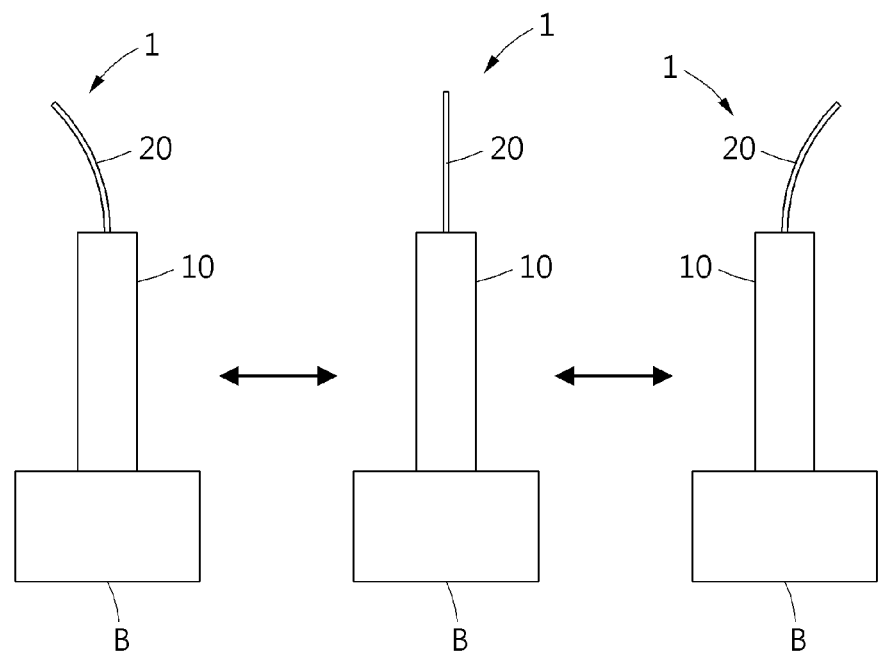
FIG. 10 illustrates an example of driving only an auxiliary deformation part of a hybrid drive device according to an example embodiment.

FIG. 10 illustrates an example of driving only an auxiliary deformation part of a hybrid drive device according to an example embodiment.

Referring to FIG. 10, the hybrid drive device 1 may drive only the auxiliary deformation part 20. The auxiliary deformation part 20 may adjust the balance of the hybrid drive device 1.

Figure 11:
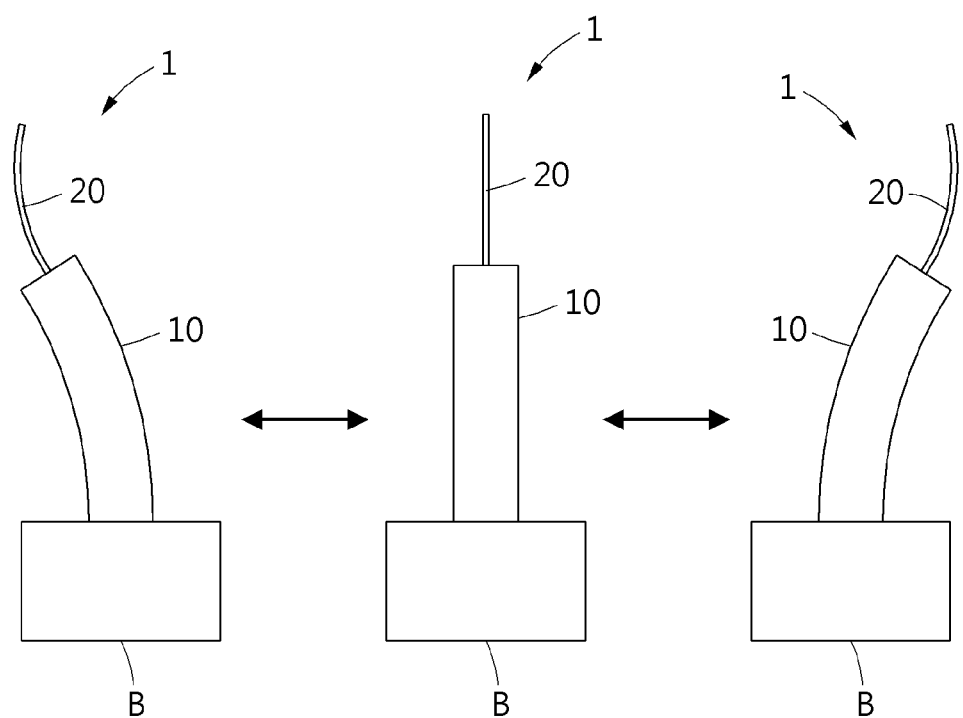
FIG. 11 illustrates an example of simultaneously driving a main deformation part and an auxiliary deformation part of a hybrid drive device according to an example embodiment.

FIG. 11 illustrates an example of simultaneously driving a main deformation part and an auxiliary deformation part of a hybrid drive device according to an example embodiment.

Referring to FIG. 11, the hybrid drive device 1 may simultaneously drive the main deformation part 10 and the auxiliary deformation part 20. The main deformation part 10 and the auxiliary deformation part 20 may independently operate, and may operate using various types of driving methods.

A number of example embodiments have been described above. Nevertheless, it should be understood that various modifications may be made to these example embodiments. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. A hybrid drive device comprising:
    a main power source;
    an auxiliary power source;
    a main deformation part configured to be deformable in response to receiving a voltage from the main power source, the main deformation part comprising:
        a first driver comprising a first main base and a first deformable member configured to be received in the first main base and to electrically connect to the main power source;
        a second driver comprising a second main base and a second deformable member configured to be received in the second main base and to electrically connect to the main power source; and
        a directional member configured to be provided between the first driver and the second driver and to set a direction in which each of the first driver and the second driver deforms; and
    an auxiliary deformation part configured to connect to the main deformation part and to be deformable in response to receiving a voltage from the auxiliary power source,
    wherein the auxiliary deformation part is configured to be supported by the directional member in a state in which at least a portion of the auxiliary deformation part is inserted into the directional member.

2. The hybrid drive device of claim 1, wherein each of the first deformable member and the second deformable member comprises a shape member alloy or a shape memory polymer.

3. The hybrid drive device of claim 1, wherein the directional member is configured to be hardened and to support the auxiliary deformation part in a state in which at least a portion of the auxiliary deformation part is received in the directional member.

4. The hybrid drive device of claim 1, wherein the auxiliary deformation part comprises:
    an auxiliary base configured to contain a cation;
    a first coating plate configured to be coated on one surface of the auxiliary base;
    a second coating plate configured to be coated on the other surface of the auxiliary base; and
    an auxiliary wire configured to connect each of the first coating plate and the second coating plate to the auxiliary power source.

5. The hybrid drive device of claim 4, wherein an end of the auxiliary wire that is connected to the first coating plate and the second plating is configured to insert into the directional member.

6. The hybrid drive device of claim 4, wherein a shape of the auxiliary base is determined based on a voltage that is applied to the first coating plate and the second coating plate.

7. The hybrid drive device of claim 6, wherein the auxiliary deformation part is configured to be supported by the main deformation part in a state in which at least a portion of the auxiliary deformation part is inserted into the main deformation part.

8. The hybrid drive device of claim 1, wherein the main deformation part is relatively rigid compared to the auxiliary deformation part.

9. The hybrid drive device of claim 1, wherein a magnitude of a voltage applied from the main power source to the main deformation part is greater than a magnitude of a voltage applied from the auxiliary power source to the auxiliary deformation part.

10. The hybrid drive device of claim 1, further comprising:
    a controller configured to control the main power source and the auxiliary power source.

11. A hybrid drive device comprising:
    a first driver comprising a first main base and a first deformable member configured to be received in the first main base and to be deformable in response to receiving a voltage from an outside;
    a second driver comprising a second main base and a second deformable member configured to be received in the second main base and to be deformable in response to receiving a voltage from the outside;
    a plurality of directional members configured to be stacked between the first driver and the second driver and to set a direction in which each of the first driver and the second driver deforms; and an auxiliary deformation part configured to connect to one of the plurality of directional members and to be deformable in response to receiving a voltage from the outside, wherein the auxiliary deformation part is configured to be supported by one of the plurality of directional members in a state in which at least a portion of the auxiliary deformation part is inserted into one of the plurality of directional members.

12. The hybrid drive device of claim 11, wherein each of the first deformable member and the second deformable member comprises a shape member alloy or a shape memory polymer.

13. The hybrid drive device of claim 11, wherein the directional member is configured to be hardened and to support the auxiliary deformation part in a state in which at least a portion of the auxiliary deformation part is received in the directional member.

14. The hybrid drive device of claim 11, wherein the auxiliary deformation part comprises:
an auxiliary base configured to contain a cation;
a first coating plate configured to be coated on one surface of the auxiliary base; and
a second coating plate configured to be coated on the other surface of the auxiliary base.

* * * * *